United States Patent [19]

Sakai et al.

[11] Patent Number: 4,746,857
[45] Date of Patent: May 24, 1988

[54] PROBING APPARATUS FOR MEASURING ELECTRICAL CHARACTERISTICS OF SEMICONDUCTOR DEVICE FORMED ON WAFER

[75] Inventors: Takamasa Sakai, Kusatsu; Motohiro Kono, Kyoto; Takayuki Umaba, Kusatsu; Yoshiyuki Nakagawa, Kyoto; Yoshihiro Koyama, Takatsuki, all of Japan

[73] Assignee: Danippon Screen Mfg. Co. Ltd., Kyoto, Japan.

[21] Appl. No.: 903,021

[22] Filed: Sep. 2, 1986

[30] Foreign Application Priority Data

Sep. 13, 1985 [JP] Japan .............................. 60-201638
Apr. 28, 1986 [JP] Japan .............................. 61-96637

[51] Int. Cl.$^4$ .................. G01R 31/02; G01R 1/06
[52] U.S. Cl. ........................... 324/158 F; 324/158 P
[58] Field of Search .......... 324/158 F, 158 P, 73 PC, 324/72.5

[56] References Cited

U.S. PATENT DOCUMENTS 4,518,914  5/1985  Okubo et al. ............... 324/158 F

OTHER PUBLICATIONS

Lockwood et al.; "Probe Cap . . . "; IBM Tech. Dis. Bull.; vol 22; No. 6; Nov., 1979; pp. 2343-2344.
Baxter et al.; "Mass Alignment . . . "; Western Electric Tech. Dig.; No. 38; Apr. 1975; pp. 5-6.

Primary Examiner—Ernest F. Karlsen
Attorney, Agent, or Firm—Hayes, Davis & Soloway

[57] ABSTRACT

A probing apparatus is used to measure electrical characteristics of a semiconductor device formed on a wafer. The apparatus includes means for holding the wafer in a vertical or slightly leaned position on a frame, a contact needle, three-directional drive means for holding the needle on the frame movably both vertically and horizontally along the device-bearing surface of the wafer and for bringing the needle into releasable contact with a desired portion of the device-bearing surface of the wafer, and a microscope provided in such a way that the tip of the needle is seen substantially at the center of the field of view, said microscope being movable together with the needle along the device-bearing surface of the wafer.

11 Claims, 3 Drawing Sheets

PROBING APPARATUS FOR MEASURING ELECTRICAL CHARACTERISTICS OF SEMICONDUCTOR DEVICE FORMED ON WAFER

BACKGROUND OF THE INVENTION (1) Field of the Invention:

This invention relates to an apparatus for measuring, by a probe, electrical characteristics of a semiconductor device formed on a wafer.

(2) Description of the Prior Art:

Apparatus often called "wafer probing machines" or "probers" have been employed to electrically measure characteristics of semiconductor devices formed on wafers or those of wafers per se. In each of such apparatus, a probing needle is usually brought into contact with a target portion of a semiconductor device to collect information or data on one or more electric characteristics of the semiconductor device at the portion. A microscope is provided in combination with the probing needle. By automatically or visually shifting the microscope and probing needle relative to the wafer, the probing needle is brought into contact precisely to the target position for measurement thereof.

FIG. 5 is a perspective view showing a conventional wafer probing machine. A wafer 1, which is to be measured, is held under vacuum suction on a sample stage 2 which is movable along three axes, X, Y and Z. An electrically-conductive needle 4 made of a material such as tungsten or the like and provided on the lower surface of an arm 3 arranged above the stage 2 is then brought into contact with a desired portion of the wafer 1. A microscope 5 is incorporated in the arm 3 in such as way that the tip of the needle 4 is contained in its field of view, preferably, almost at the center. While watching the positions of the tip of the needle and the device on the wafer, the stage 2 is moved in the X-Y directions until a desired portion of the device is aligned with the tip of the needle. Thereafter, the stage 2 is raised along the Z-axis so as to bring the desired portion of the device into contact with the tip of the needle 4. Information or data collected as a result of the above contact are then input to a processing unit 8 through wires 6,7.

Such wafer probing machines are well-known and several kinds of apparatus have been put on the market, including for example an apparatus with a plurality of needles arranged in a pattern corresponding to the layout of plural terminals in a semiconductor device, an apparatus with a relay matrix interposed between a probing needle and a plurality of processing units designed respectively for plural kinds of characteristics to be measured, etc.

These conventional apparatus generally take horizontal forms, that is, the wafer 1 is set on the horizontal stage 2 as depicted in FIG. 5. They are hence accompanied by the following drawbacks.

First of all, a structure such as the microscope 5 is arranged above the wafer 1. There is thus a danger that upon focusing, dust such as fine metal particles could drop onto the surface of the wafer 1 and might stick there. Such dust interferes its measurement and moreover, becomes a cause for a defect to the quality of the semiconductor device itself.

In a horizontal apparatus of the above-mentioned sort, it is necessary to make large the distance between the stage 2 and the processing unit 8 so as to permit movements of the sample stage 2 in the X and Y directions. The arm 3 which is provided on the rear side of the stage 2 or on the side opposite to the position of the processing unit 8 and carries the needle 4 and microscope 5 thereon is in the form of an elongated cantilever arm supported at a point outside the moving stroke of the stage 2. Due to this structural requirement, the arm 3 tends to undergo vibrations. Since the pattern of a semiconductor device to be measured has a minute size, for example, 200 μm square on the other hand, it is essential to use a wire of an extremely fine diameter as the contact needle 4. If the arm 3 supporting the needle thereon is subjected to vibrations, the amplitude of the vibrations is magnified at the tip of the needle 4. This makes it difficult to align the tip of the needle 4 with a desired portion of the pattern.

As the distance becomes longer between the stage 2 and the processing unit 8, the lengths of lead wires 6,7 connecting them together become longer. Here, it should be noted that a probing machine of the above sort is not necessarily limited to the use of a single processing unit 8 but in many instances, uses a plurality of processing units in parallel. The lengths of wires which connect them together become substantial as a consequence. If these wires are unduly long or their lengths are different, phase shifts occur among high frequency measurement signals, leading to such problems that calibration such as zero adjustment may be rendered difficult and/or measurements may be rendered difficult due to production of noises.

When $N_2$ gas of a low temperature is blown from the periphery of the stage 2 in a conventional apparatus of the horizontal type in order to conduct measurements at a predetermined low temperature, the low-temperature gas meets together at the center of the stage 2 and then flows upwards. The low-temperature gas may hence frost the objective lens of the microscope 5.

In the case of apparatus of the horizontal type, operator are required to take bent positions upon measurements as shown in FIG. 6. When they are required to work for many hours, their working positions may cause lumbagos. Such working positions are certainly undesirable from the viewpoint of human engineering.

In addition, there have also been known wafer probing machines in each of which a semiconductor device is measured while it is heated. As their heating means, there have been known an electric heater built in a stage on which a semiconductor device is held, a heating system in which an inert gas heated by heating means provided at a location remote from a stage is guided through a pipe line to a nozzle provided near the stage and is then blown out from the nozzle against a semiconductor device held on the stage. These conventional heating systems are also accompanied by one or more problems.

The heating means making use of an electric heater built in a stage is widely used, as a common technique, in spin processing apparatus for the coating or etching of semiconductor devices. This heating means is however accompanied by a problem that if it is employed in a probing machine, measurement results are unavoidably affected by electrical or magnetic noises generated from the electric heater and the characteristics of the semiconductor device cannot be measured accurately.

Turning next to the means for blowing a heated inert gas, this is an indirect heating system in which the heat of the electric heater is transmitted to the semiconductor device by means of the gas. This heating means is hence accompanied, for example, by the following shortcomings. The responsibility of the heating means is low and its temperature control is inaccurate. Its heating efficiency is low and a lot of energy is wasted. When an electric heater is used to heat the inert gas, the heating means is provided at a suitable position remote from the stage in order to avoid effects of electrical or magnetic noises for the same reasons as mentioned above. The pipe line for the high-temperature gas is hence long and a lot of energy is lost while the high-temperature gas is transmitted through the pipe line. A great deal of gas is required to raise the temperature of the device to a desired level because the thermal capacity of the gas is small. This is certainly uneconomical. The gas is blown out from one side of the stage and is exhausted at the opposite side. Accordingly, the device is heated to a lower temperature at the exhaust side compared with the blowing side. Therefore, the heating cannot be effected evenly.

SUMMARY OF THE INVENTION

An object of this invention is to provide a probing apparatus which has no movable parts arranged above a stage so as to avoid deposition of dust on a device under measurement.

Another object of this invention is to provide a probing apparatus of such a structure that can avoid vibrations of an arm on which a contact needle is held.

A further object of this invention is to provide a probing apparatus of such a structure that enables to shorten the lengths of lead wires between a stage and a processing unit.

A still further object of this invention is to provide a probing apparatus in which a stage is heated directly by an electric or gas heater, the effects of electrical or magnetic noises are avoided, and the problem of uneven heating is overcome.

In one aspect of this invention, there is thus provided a probing apparatus for measuring electrical characteristics of a semiconductor device formed on a wafer. The probing apparatus comprises:

means for holding said wafer in a vertical or slightly leaned position on a frame;

a contact needle adapted to be brought into contact with a desired portion of said device so as to collect information on electrical characteristics at said portion;

three-directional drive means for holding said needle on said frame in such a way that said needle is caused to move vertically and horizontally along the device-bearing surface of said wafer and is brought into releasable contact with said desired portion of said device-bearing surface of said wafer; and a microscope provided in such a way that the tip of said needle is seen substantially at the center of the field of view, said microscope being movable together with said needle along said device-bearing surface of said wafer.

The probing apparatus of this invention has brought about numerous advantages. It is of the vertical type and is thus free from such a danger that dust could deposit on the surface of the wafer. The moving mechanism on which the probing head is supported can be formed into a stable and firm structure. Accordingly, it does not produce vibrations. Since the lengths of lead wires from the contact needle to the processing unit can be shortened compared with conventional apparatus of the horizontal type, collected signals are hence free of phase shift. Furthermore, operators can work in comfortable positions owing to the vertical structure of the probing apparatus.

BRIEF DESCRIPTION OF THE DRAWINGS

These and other objects, advantages and features of the invention will become more fully apparent as reference is had to the accompanying specification and drawings wherein.

DETAILED DESCRIPTION OF THE INVENTION AND PREFERRED EMBODIMENTS

Figure 1:
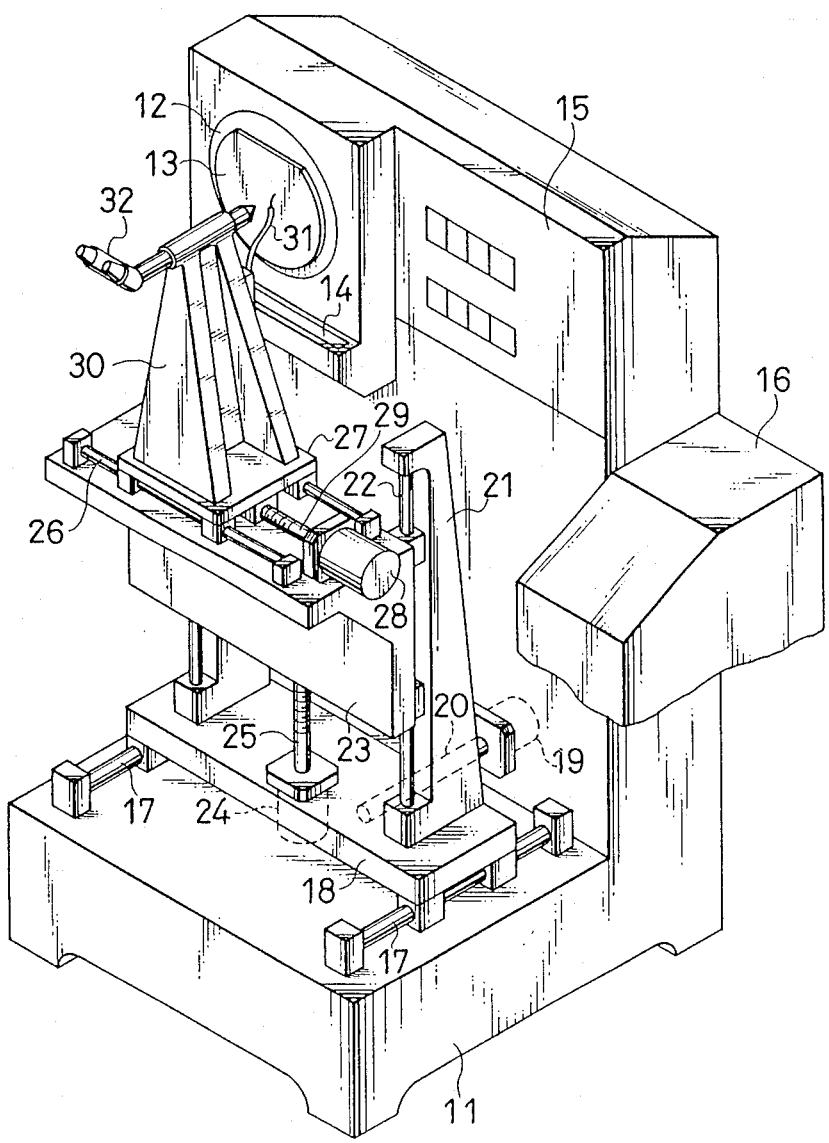
FIG. 1 is a perspective view of a probing apparatus according to one embodiment of this invention.

Referring first to FIG. 1, a wafer holding stage 12 is provided at an upper part of an L-shaped frame 11. A wafer 13 on which there is formed a semiconductor device to be measured is held under vacuum on the stage 12. Although the stage 12 is provided upright in the illustrated embodiment, it may be slightly leaned rearwards.

Below the stage 12, a nozzle 14 in the form of a slit is provided. When the device is measured at a low temperature, a low-temperature inert gas such as $N_2$ gas is jetted out as a laminar flow along the surface of the wafer 13. If necessary, the whole apparatus may be enclosed within a gas chamber and a suction duct may be provided at the uppermost part of the chamber in order to recover $N_2$ gas therethrough.

A data display panel 15, operation switch board 16, etc. are also arranged on the frame 11.

A pair of rails 17,17, which serve to guide a saddle 18, are provided on the base of the frame 11. The saddle 18 is driven by means of a screw 20, which is driven by a motor 19 and extends in parallel with the rails 17,17, and a nut (not shown).

A pair of stands 21,21, which are respectively provided with vertical guide rails 22,22, are mounted on the saddle 18. A vertically-slidable base 23 supported on the rails 22,22 is driven by a motor 24 by way of a screw 25, which is provided in parallel with the rails 22,22, and a nut (not shown).

These saddle and bases are moved via their respective control switches provided on the operation switch board 16. It is however not essential to provide these control switches on the operation switch board 16. They may be provided, for example, on a remote control panel which is separated from the frame 11.

A pair of brackets 30,30 are provided upright on the horizontally-slidable base 27. A contact needle 31 and microscope 32 are mounted on the brackets 30,30.

Similar to conventional probing machines, the tip of the needle 31 is made of a conductive material such as tungsten. By the above-described three-directional movement control, the tip of the needle 31 is moved vertically and horizontally in parallel with the surface of the wafer 13 and is then brought into contact with a desired portion of the surface of the wafer.

The microscope 32 is mounted on the brackets 30,30 in such a way that the tip of the needle 31 is located almost centrally in the field of view and the optical axis of its objective lens extends at a right angle relative to the plane of the wafer 13. The focal point of the microscope 32 is adjusted so that when the probing needle 31 is retreated from the surface of the wafer 31, the operator is allowed to visually inspect the pattern formed on the wafer 13.

When the whole apparatus is enclosed within a gas chamber, it is necessary to maintain the eye-piece of the microscope 32 outside the gas chamber by means of an air-tight membrane or the like.

The operation of the probing apparatus shown in FIG. 1 will next be described.

The wafer 13 bearing thereon the semiconductor device to be measured is held under vacuum on the stage 12. Low-temperature $N_2$ gas is jetted out through the nozzle 14, whereby the wafer 13 is cooled to a predetermined measurement temperature while shielding the surface of the wafer 13 from air and avoiding possible deposition of dust thereon. Here, the low-temperature gas is allowed to flow upwards as a laminar flow along the surface of the wafer 13 and is then recovered through a duct (not shown). Therefore, the microscope 32 is protected from over-cooling and is hence not frosted.

While watching the pattern of the device formed on the wafer 13 through the microscope 32, the motors 24,28 are controlled via their respective switches on the operation board 16 or a remote control panel (not shown) so that the microscope 32 and contact needle 31 are moved vertically and horizontally until the tip of the needle 31 is aligned with the position of a desired terminal of the device to be measured. This alignment can be achieved easily because the contact needle 31 and microscope 32 are moved as unitary members while maintaining the tip of the contact needle 31 at the center of the field of view of the microscope 32.

After completion of the desired alignment, the motor 19 is then controlled via its corresponding switch so that the saddle 18 is caused to advance until the tip of the contact needle 31 is brought into contact with the desired terminal. Owing to this contact, measurements are effected, the resulting data are processed by the processing unit built in the frame 11, and the results of the processing are then displayed on the display panel 15.

After completion of the above measurements at the terminal, the motor 19 is driven via its corresponding switch so as to retreat the saddle 18. The tip of the contact needle 31 is thus separated from the surface of the wafer 13. Thereafter, the microscope 32 and contact needle 31 are moved to another position, where the tip of the contact needle 31 is aligned with a next terminal to be measured. Measurements are then effected in the same manner.

The above probing apparatus has brought about numerous advantages. It is of the vertical type and is thus free from such a danger that dust could deposit on the surface of the wafer. The moving mechanism on which the probing head is supported can be formed into a stable and firm structure. Accordingly, it does not produce vibrations. Since the lengths of lead wires from the contact needle to the processing unit can be shortened compared with conventional apparatus of the horizontal type, collected signals are hence free of phase shift. Furthermore, operators can work in comfortable positions owing to the vertical structure of the probing apparatus.

Figure 2:
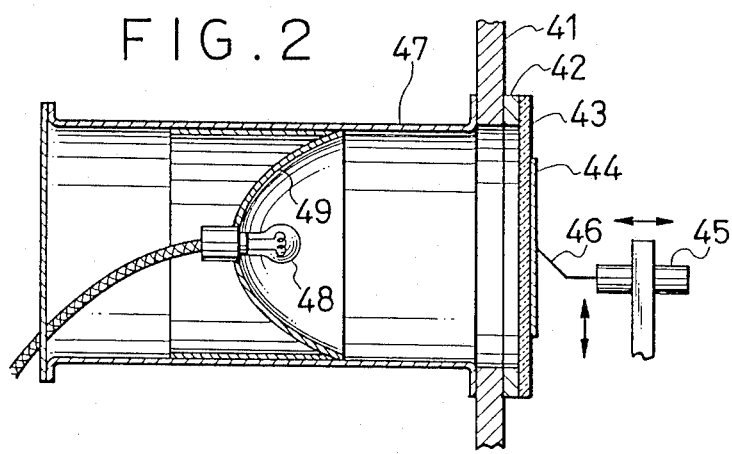
FIGS. 2 through 4 are cross-sectional views of typical heating units incorporated in the probing apparatus of FIG. 1.
Figure 3:
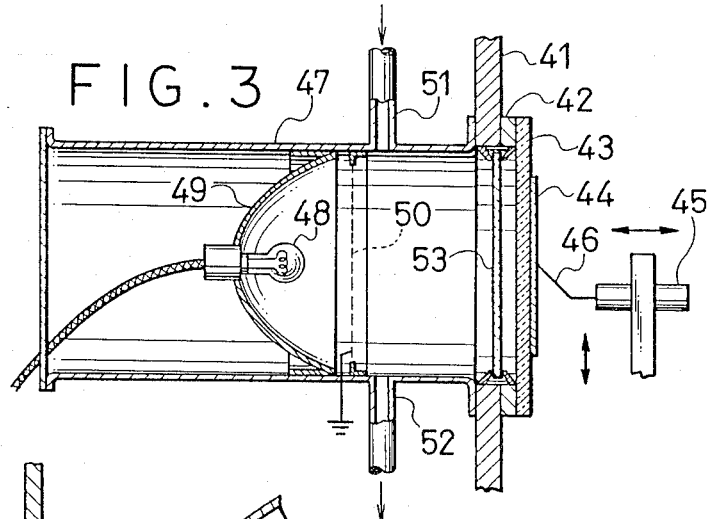
Figure 4:
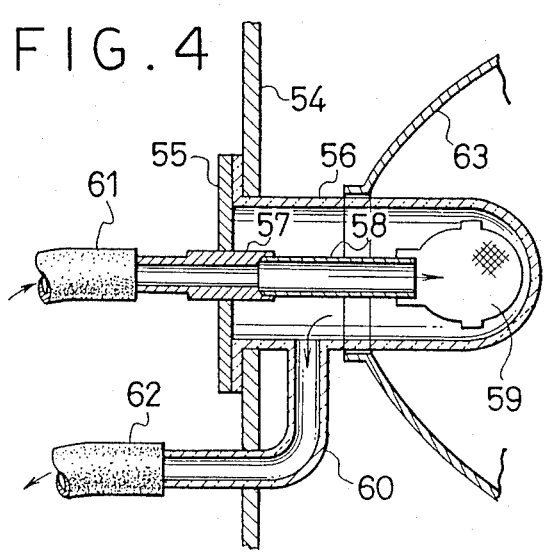
Figure 5:
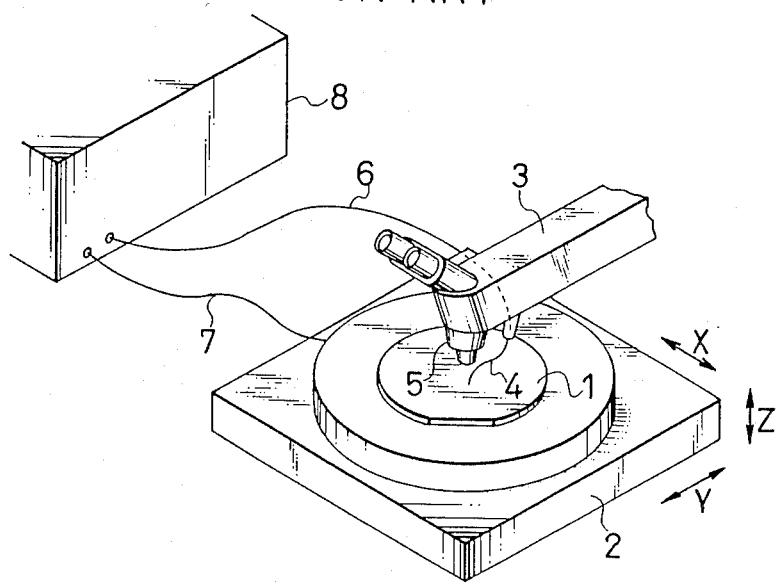
FIG. 5 is a schematic perspective view of a conventional horizontal-type probing machine.
Figure 6:
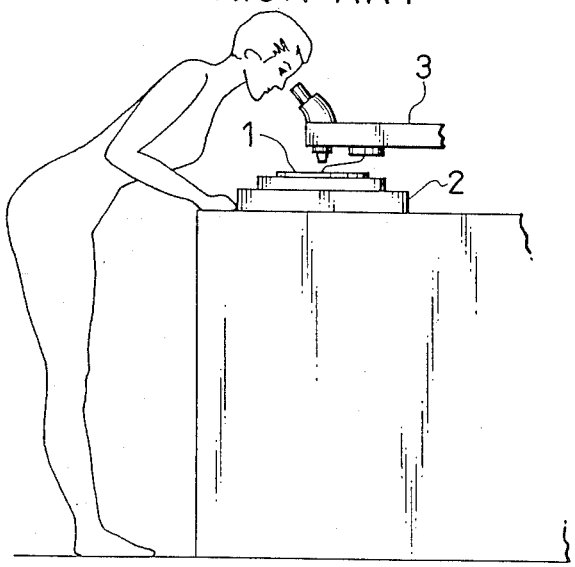
FIG. 6 shows an operator's position which he takes upon conducting a measurement on the conventional horizontal-type probing machine of FIG. 5.

In the above embodiment, the wafer 13 is cooled upon its measurements. In some cases, it may however be necessary to conduct measurements at a temperature higher than the ambient temperature, that is, while heating the wafer 13. FIGS. 2 through 4 illustrate different embodiments for this requirement.

FIG. 2 is a cross-sectional view of the stage 12 of the apparatus shown in FIG. 1. A stage 43 is vertically provided on a frame 41, which is equivalent to the frame 11 in FIG. 1, of the probing machine by way of an insulating plate 42 made of a plastic material or the like. A wafer 44 which is of the same type as the wafer 13 in FIG. 1 is held under vacuum on the stage 43. A probing head 45 is moved in directions parallel to the plane of the wafer 44 and in a direction perpendicular to the plane of the wafer 44, whereby a contact needle 46 is brought into contact with a desired portion of a semiconductor device formed on the wafer 44.

The stage 43 is made of an opaque and conductive material. A heater case 47 is provided on the rear side of the stage 43. An electric heater 48 capable of emitting infrared rays such as a halogen lamp is installed within the case 47. In order to improve the heating efficiency, a paraboloidal reflector 49 is provided with the electric heater 48 so as to reflect infrared rays toward the stage 43.

Since the quantity of infrared rays to be emitted can be adjusted by controlling the voltage to be applied to the electric heater 48, it is easy to adjust the temperature of the stage 43 to a desired level and to maintain it at the same level by controlling the voltage.

The heating device illustrated in FIG. 2 allows a greater distance between the halogen lamp 48 and stage 43 compared with a conventional manner of installation employed often in spin processors, namely, the installation of an electric heater in contact with the rear side of a stage. Electrical noises which the electric heater produces are hence attenuated to a practically-acceptable noise level while they travel along the distance.

FIG. 3 shows another embodiment which permits a further reduction to the noise level owing to the provision of some additional parts. In FIG. 3, the frame 41, insulating plate 42, stage 43, wafer 44, probing head 45, contact needle 46, heater case 47, halogen lamp 48 and paraboloidal reflector 49 are the same as their corresponding elements in FIG. 2.

In the heating device depicted in FIG. 3, a conductive mesh 50 which is grounded is interposed between the lamp 48 and stage 43. The conductive mesh 50 thus serves as a noise filter which shields out electrical noises emitted from the lamp 48. The mesh 50 should be made of fine wires so that infrared rays, which have been emitted from the lamp 48 and reflected by reflector 49 toward the stage 43, can be easily transmitted therethrough.

In order to avoid overheating of parts other than the stage 43 and wafer 44, tubes 51,52 are provided at suitable locations of the heater case 47 for the introduction of a cooling gas and for the exhaust of the cooling gas respectively. As the cooling gas, air of $N_2$ gas is blown into the case 47.

A plate 53 made of a material permitting transmission of infrared rays thereof such as glass is also provided to isolate the stage 43 from the stream of the cooling gas so that the heating efficiency to the stage 43 is not lowered by the cooling gas.

In this embodiment, the conductive mesh 50 interposed between the halogen lamp 48 and stage 43 serves as a noise filter. Unless the mesh 50 is provided, some noises may be allowed to reach the stage 43 in spite of the distance between the lamp 48 and the stage 43. The provision of the mesh 50 can eliminate such noises completely, so that measurements can be performed under completely noiseless conditions.

In the embodiments of FIGS. 2 and 3, the halogen lamps are used as heating devices. Xenon lamps, ceramic heaters or the like may also be used.

FIG. 4 shows the third embodiment of the heating device, in which a mantle-equipped gas burner is employed. The elements of structure numbered from 41 to 47 in FIGS. 2 and 3 are commonly used in this third embodiment and their illustration and description are hence omitted.

On a wall 54 provided on a suitable part of the heater case 47, there are provided a holder plate 55 and a trapping cup 56 which is made of a heat-resistant material such as tempered glass. A gas supply tube 57 and burner pipe 58 are supported on the plate 55 and a mantle 59 is provided on the tip of the burner pipe 58. The trapping cup 56 is equipped with an exhaust tube 60. The gas supply tube 57 and exhaust tube 60 are connected respectively to flexible pipes 61,62. The flexible pipe 62, which is coupled at one end thereof with the exhaust tube 60, is connected at the other end thereof to an unillustrated gas suction means, for example, motor fun. A paraboloidal reflector 63 is also provided on the outer wall of the cup 56.

A suitable combustible gas is fed from the pipe 61 to the burner pipe 58 by way of the gas supply tube 57. The gas is then caused to burn by a suitable ignitor at the tip of the pip 58, whereby the mantle 59 is red-heated to produce infrared rays. The infrared rays are then radiated either directly or after reflection by the reflector 63 toward a stage located on the right as viewed in FIG. 4.

The gas burner is used as a heating device for emitting infrared rays in this embodiment. This third embodiment therefore has an advantage that electric or magnetic noises, which disturb measurements, are not produced at all.

Having now fully described the invention, it will be apparent to one of ordinary skill in the art that many changes and modifications can be made thereto without departing from the spirit or scope of the invention as set forth herein.

We claim:

1. A probing apparatus for measuring electrical characteristics of a semiconductor device formed on a wafer, comprising:
   means for holding said wafer in a vertical or slightly leaned position on a frame;
   nozzle means, provided below said wafer holding means, adapted to supply inert gas upwardly along the device-bearing surface of said wafer;
   a contact needle adapted to be brought into contact with a desired portion of said device so as to collect information on electrical characteristics at said portion;
   three-directional drive means for holding said needle on said frame in such a way that said needle is caused to move vertically and horizontally along the device-bearing surface of said wafer and is brought into releasable contact with said desired portion of said device-bearing surface of said wafer; and
   a microscope provided in such a way that the tip of said needle being substantially at the center of the microscope's field of view, said microscope being movable together with said needle along said device-bearing surface of said wafer.

2. The probing apparatus as claimed in claim 1, wherein said wafer holding means holding said wafer under suction by a vacuum force.

3. A probing apparatus for measuring electrical characteristics of a semiconductor device formed on a wafer, comprising;
   means for holding said wafer in a vertical or slightly leaned position on a frame;
   a contact needle adapted to be brought into contact with a desired portion of said device so as to collect information on electrical characteristics at said portion;
   three-directional drive means for holding said needle on said frame in such a way that said needle is caused to move vertically and horizontally along the drive-bearing surface of said wafer and is brought into releasable contact with said desired portion of said device-bearing surface of said wafer;
   a microscope provided in such a way that the tip of said needle being substantially at the center of the microscope's field of view, said microscope being movable together with said needle along said device-bearing surface of said wafer; and
   infrared heating means provided with a predetermined interval on the rear side of said wafer holding means, said rear side being opposite to the side on which said wafer is held, whereby said wafer is heated by infrared rays emitted from said infrared heating means.

4. The probing apparatus as claimed in claim 3, wherein said heating means is provided with a paraboloidal reflector so that infrared rays are reflected toward said wafer holding means.

5. The probing apparatus as claimed in claim 3, wherein said heating means is an electric heater.

6. The probing apparatus as claimed in claim 5, wherein said electric heater is a halogen lamp.

7. The probing apparatus as claimed in claim 5 or 6, further comprising a conductive mesh disposed between said heating means and wafer holding means so as to shield electrical or magnetic noises from said heating means.

8. The probing apparatus as claimed in claim 3, wherein said heating means is a gas burner equipped with a mantle which emits infrared rays when heated.

9. The probing apparatus as claimed in claim 3 or 9, wherein said heating means is provided with a gas cooling system.

10. The probing apparatus as claimed in claim 9, further comprising a wall interposed between said heating means and wafer holding means, said wall permitting transmission of infrared rays therethrough.

11. An essentially vibration free probing apparatus for measuring electrical characteristics of a semiconductor device formed on a wafer, comprising:
   means for holding said wafer in a vertical or slightly leaned position on a frame for reducing dust and metal particle deposits on a device-bearing surface of the wafer and thereby improving the measurement of the electrical characteristics of the semiconductor device;

a contact needle adapted to be brought into contact with a desired portion of said device so as to collect information on electrical characteristics at said portion, said contact needle being connected by a sufficiently short connecting wire to minimize phase shifting of high frequency signals;

three-directional drive means for holding said needle on said frame in such a way that said needle is caused to move vertically and horizontally along the device-bearing surface of said wafer and is brought into releasable contact with said desired portion of said device-bearing surface of said wafer;

a microscope provided in such a way that the tip of said needle being substantially at the center of the microscope's field of view, said microscope being movable together with said needle along said device-bearing surface of said wafer; and nozzle means, provided below said wafer holding means, adapted to supply inert gas upwardly along the device-bearing surface of said wafer and thereby prevent of frosting of the microscope lens.

* * * * *